(12) United States Patent
Rolandi et al.

(10) Patent No.: US 9,153,437 B2
(45) Date of Patent: Oct. 6, 2015

(54) INORGANIC NANOSTRUCTURE REACTIVE DIRECT-WRITE AND GROWTH

(75) Inventors: Marco Rolandi, Seattle, WA (US); Hideki Sato, Hino (JP); Stephanie Vasko, Seattle, WA (US); Michael Brasino, Issaquah, WA (US); Adnan Kapetanovic, Tukwila, WA (US); Vamsi Talla, Seattle, WA (US)

(73) Assignee: University of Washington through its Center for Commercialization, Seattle, WA (US)

( * ) Notice: Subject to any disclaimer, the term of this patent is extended or adjusted under 35 U.S.C. 154(b) by 0 days.

(21) Appl. No.: 14/009,000

(22) PCT Filed: Mar. 30, 2012

(86) PCT No.: PCT/US2012/031701
§ 371 (c)(1),
(2), (4) Date: Feb. 28, 2014

(87) PCT Pub. No.: WO2012/135768
PCT Pub. Date: Oct. 4, 2012

(65) Prior Publication Data
US 2014/0162436 A1    Jun. 12, 2014

Related U.S. Application Data

(60) Provisional application No. 61/469,626, filed on Mar. 30, 2011.

(51) Int. Cl.
*H01L 21/36*    (2006.01)
*H01L 21/02*    (2006.01)
(Continued)

(52) U.S. Cl.
CPC ...... *H01L 21/02636* (2013.01); *B81C 1/00492* (2013.01); *B82Y 10/00* (2013.01);
(Continued)

(58) Field of Classification Search
CPC .................. H01L 21/02636; H01L 21/02532; H01L 21/02656; H01L 51/0005; H01L 51/0006; H01L 51/0021; H01L 51/0022
USPC .......................................................... 438/478
See application file for complete search history.

(56) References Cited

U.S. PATENT DOCUMENTS

2003/0022470 A1*  1/2003  Liu et al. ........................ 438/496
2003/0162004 A1   8/2003  Mirkin
(Continued)

FOREIGN PATENT DOCUMENTS

KR    10-2008-0021103 A    3/2008

OTHER PUBLICATIONS

Albonetti, C., et al., "Parallel-Local Anodic Oxidation of Silicon Surfaces by Soft Stamps," Nanotechnology 19(43): 435303, Oct. 2008, 9 pages.
(Continued)

*Primary Examiner* — Brook Kebede
(74) *Attorney, Agent, or Firm* — Christensen O'Connor Johnson Kindness PLLC

(57) ABSTRACT

Methods for forming inorganic nanostructures are provided. The methods create the inorganic nanostructures by positioning a writing electrode (e.g., a conductive "stamp") spaced nanometers above a substrate such that a precursor is intermediate the two. Applying an electric field, a voltage bias, an ionic current, or an electronic current between the writing electrode and the substrate converts the precursor into an inorganic solid material (e.g., a semiconductor such as silicon or germanium) in the area of the writing electrode.

24 Claims, 13 Drawing Sheets

(51) Int. Cl.
*B82Y 10/00* (2011.01)
*B82Y 40/00* (2011.01)
*G03F 7/00* (2006.01)
*B81C 1/00* (2006.01)

(52) U.S. Cl.
CPC ............. *B82Y 40/00* (2013.01); *G03F 7/0002* (2013.01); *H01L 21/02532* (2013.01); *B81C 2201/0154* (2013.01); *H01L 21/02656* (2013.01)

(56) References Cited

U.S. PATENT DOCUMENTS

2003/0178316 A1 9/2003 Jacobs
2011/0147724 A1* 6/2011 Ha et al. ........................ 257/40

OTHER PUBLICATIONS

Bellido, E., et al., "Controlling the Number of Proteins With Dip-Pen Nanolithography," Advanced Materials 22(3):352-355, Jan. 2009.
Braunschweig, A.B., et al., "Molecular Printing," Nature Chemistry 1(5):353-358, Aug. 2009. (Author Manuscript provided, PMCID: PMC3936963, available in PMC Feb. 27, 2014, 15 pages).
Cavallini, M., et al., "Parallel Writing by Local Oxidation Nanolithography With Submicrometer Resolution," Applied Physics Letters 83(25):5286-5288, Dec. 2003.
Chen, R., et al., "Nanolasers Grown on Silicon," Nature Photonics 5(3):170-175, Mar. 2011.
Chockla, A.M., and B.A. Korgel, "Seeded Germanium Nanowire Synthesis in Solution," Journal of Materials Chemistry 19(7):996-1001, Feb. 2009.
Ehrics, E.E., et al., "Direct Writing of 10 nm Features With the Scanning Tunneling Microscope," Applied Physics Letters 53(1):2287-2289, Jul. 1988.
Germain, J., et al., "Sulfur as a Novel Nanopatterning Material: An Ultrathin Resist and a Chemically Addressable Template for Nanocrystal Self-Assembly," Advanced Materials 20(23):4526-4529, Dec. 2008.
Greytak, A.B., et al., "Growth and Transport Properties of Complementary Germanium Nanowire Field-Effect Transistors," Applied Physics Letters 84(21):4176-4178, May 2004.
Kent, A.D., et al., "Growth of High Aspect Ratio Nanometer-Scale Magnets With Chemical Vapor Deposition and Scanning Tunneling Microscopy," Science 262(5137):1249-1252, Nov. 1993.
Knoll, A.W., et al., "Probe-Based 3-D Nanolithography Using Self-Amplified Depolymerization Polymers," Advanced Materials 22(31):3361-3365, Aug. 2010.
Ko, H., et al., "Ultrathin Compound Semiconductor on Insulator Layers for High-Performance Nanoscale Transistors," Nature 468(7321):286-289, Nov. 2010.
Kuykendall, T., et al., "Crystallographic Alignment of High-Density Gallium Nitride Nanowire Arrays," Nature Materials 3(8):524-528, Aug. 2004.
Laracuente, A., et al., "Chemical Vapor Deposition of Nanometer-Size Aluminum Features on Silicon Surfaces Using an STM Tip," Applied Surface Science 107:11-17, Nov. 1996.
Lill, M., and B. Schröder, "Preparation of Amorphous Hydrogenated Silicon-Germanium Material and Solar Cells Using the Thermocatalytic Chemical Vapor Deposition," Applied Physics Letters 74(9):1284-1286, Mar. 1999.
Martinez, R.V., et al., "Patterning Polymeric Structures With 2 nm Resolution at 3 nm Half Pitch in Ambient Conditions," Nano Letters 7(7):1846-1850, Jul. 2007.
Meyerson, B.S., "UHV/CVD Growth of Si and Si:Ge Alloys: Chemistry, Physics, and Device Applications," Proceedings of the IEEE 80(10):1592-1608, Oct. 1992.
Mooney, P.M., and J.O. Chu, "SiGe Technology: Heteroepitaxy and High-Speed Microelectronics," Annual Review of Materials Science 30:335-362, Aug. 2000.
Paniccia, M., et al., "Optical Probing of Flip Chip Packaged Microprocessors," Journal of Vacuum Science and Technology B 16(6):3625-3630, Nov./Dec. 1998.
Pellegrino, L., et al., "(Fe, Mn)$_3$O$_4$ Nanochannels Fabricated by AFM Local-Oxidation Nanolithography Using Mo/Poly(methyl methacrylate) Nanomasks," Advanced Materials 18(23):3099-3104, Dec. 2006.
Pires, D., et al., "Nanoscale Three-Dimensional Patterning of Molecular Resists by Scanning Probes," Science 328(5979):732-735, May 2010.
Potapov, A.V., et al., "The Growth Kinetics of Si$_{(1-x)}$Ge$(x)$ Layers From SiH$_4$ and GeH$_4$," Thin Solid Films 336(1-2):191-195, Dec. 1998.
Quist, A.P., et al., "Recent Advances in Microcontact Printing," Analytical and Bioanalytical Chemistry 381(3):591-600, Feb. 2005.
Rolandi, M., et al., "Fluorocarbon Resist for High-Speed Scanning Probe Lithography," Angewandte Chemie 119(39):7621-7624, Oct. 2007.
Rolandi, M., et al., "A New Scanning Probe Lithography Scheme With a Novel Metal Resist," Advanced Materials 14(3):191-194, Feb. 2002.
Salaita, K., et al., "Massively Parallel Dip-Pen Nanolithography With 55000-Pen Two-Dimensional Arrays," Angewandte Chemie International Edition 45(43):7220-7223, Nov. 2006.
Soref, R., "The Past, Present, and Future of Silicon Photonics," IEEE Journal of Selected Topics in Quantum Electronics 12(6):1678-1687, Nov./Dec. 2006.
Suez, I., et al., "High-Field Scanning Probe Lithography in Hexadecane: Transition From Field Induced Oxidation to Solvent Decomposition Through Surface Modification," Advanced Materials 19(21):3570-3573, Nov. 2007.
Tian, B., et al., "Single-Crystalline Kinked Semiconductor Nanowire Superstructures," Nature Nanotechnology 4(12):824-829, Dec. 2009.
Torrey, J.D., et al., "Scanning Probe Direct-Write of Germanium Nanostructures," Advanced Materials 22(41):4639-4642, Nov. 2010.
Tromp, R.M., and F.M. Ross, "Advances in In Situ Ultra High Vacuum Electron Microscopy: Growth of SiGe on Si," Annual Review of Materials Science 30:431-439, Aug. 2000.
Tseng, A.A., et al., "Nanofabrication by Scanning Probe Microscope Lithography: A Review," Journal of Vacuum Science and Technology B 23(3):877-894, May/Jun. 2005.
Vasko, S.E., et al., "Insights Into the High-Field Chemistry of Diphenylgermane," Physical Chemistry Chemical Physics 13(11):4842-4845, Feb. 2011.
Wei, Z., et al., "Nanoscale Tunable Reduction of Graphene Oxide for Graphene Electronics," Science 328(5984):1373-1376, Jun. 2010.
Wu, Y., et al., "Single-Crystal Metallic Nanowires and Metal/Semiconductor Nanowire Heterostructures," Nature 430(6995):61-65, Jul. 2004.
Yoon, J., et al., "GaAs Photovoltaics and Optoelectronics Using Releasable Multilayer Epitaxial Assemblies," Nature 465(7296):329-333, May 2010.
Rolandi, M., et al., "Atomic Force Microscope Direct Write of Inorganic Nanowires," 11th International Conference on Advanced Materials (ICAM 2009), Rio de Janeiro, Sep. 20-25, 2009, 1 page.
International Search Report and Written Opinion mailed Aug. 28, 2012, issued in corresponding Application No. PCT/US2012/031701, filed Mar. 30, 2012, 8 pages.

* cited by examiner

INORGANIC NANOSTRUCTURE REACTIVE DIRECT-WRITE AND GROWTH

CROSS-REFERENCE TO RELATED APPLICATION

This application claims the benefit of U.S. Provisional Application No. 61/469,626, filed Mar. 30, 2011, which is hereby expressly incorporated by reference in its entirety.

STATEMENT OF GOVERNMENT LICENSE RIGHTS

This invention was made with Government support under CHE-1012419 awarded by the National Science Foundation. The Government has certain rights in the invention.

BACKGROUND

Recent advances in epitaxial transfer and vapor-liquid-solid growth (VLS) have demonstrated precise materials integration in semiconductor nanostructures. These nanostructures will likely play a key role in the future of electronic and photonic devices. Advantages of multi-material nanostructures range from strain induced gain in charge carrier mobility to composition dependent band gap engineering. Epitaxial transfer produces high performance electronic and photonic devices. However, epitaxial transfer still involves traditional semiconductor fabrication, which may not be the best option when performance is not the only design driver. Amongst these, solid-state semiconductor photovoltaic applications would greatly benefit from a less demanding materials integration alternative. VLS growth offers a cost-effective wide library of available materials ranging from Si, Ge, $Si_{1-x}Ge_x$ and III-Vs. While geometry and placement control has been greatly improved, obtaining deterministic growth for effective on-chip integration is still challenging.

An intriguing strategy is to localize growth using scanning probes instead of a catalyst particle. This strategy allows precise control over growth placement as well as growth direction. In this fashion, metallic and semiconductor features have been demonstrated via scanning tunneling microscope chemical vapor deposition (STM-CVD). However, low throughput and high vacuum conditions required during growth limit such nanostructures to laboratory devices. The atomic force microscope (AFM) can fabricate nanostructures in ambient conditions. Several AFM techniques such as dip-pen nanolithography (DPN) and high-field carbon direct-write have been successfully demonstrated with greatly increased throughput. DPN affords fast writing at large scale with multiple self-aligned parallel tips. High throughput large-scale carbon direct-write can be performed at 1 cm $s^{-1}$ tip speeds or by using microstructured conducting stamps that mimic multiple parallel tips.

In spite of recent advances in methods for forming nanostructures, further developments related to parallel fabrication methods for inorganic nanostructures are still desirable.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In one aspect, a method is provided for forming a pattern on a substrate. In one embodiment, the method includes the steps of:

(a) positioning a writing electrode at a distance of from 0 nm to 500 nm above a substrate surface that is selected from the group consisting of a conductive substrate, a semiconductive substrate, and an insulating surface that is a thin film covering a conductive or semiconductive material;

wherein a precursor is disposed intermediate the writing electrode and the substrate surface, the precursor having a composition configured to provide an inorganic solid material when reacted with a combination of field-emitted electrons and an electric field of $10^7$ V/m or greater; and (b) applying an electric field between the substrate surface and the writing electrode, and thereby through the precursor, to provide a printed pattern of the inorganic solid material on the substrate.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

NEXAFS spectra acquired at the onset of the C K-edge (j, 285.7 eV) on Si pads written from DPS, Ge pads written from DPG, and pads written with n-octane precursor to verify C content of Si and Ge structures.

FIGS. 4A-4D. Gold coated PDMS stamp mounted in an AFM quartz liquid cell (A). Silicon substrate in the AFM setup (B). Liquid cell loaded with the stamp mounted in the AFM setup (C). Schematic of the deposition process via stamping (D).

FIGS. 5A-5D, Gold coated PDMS stamp mounted in an AFM quartz liquid cell (A). Tapping mode AFM images of stamp master (B). Si structures fabricated on the Si substrate application of a 31.2 V pulse for 2 minutes (C). Ge structures fabricated on the silicon substrate by the application of a 31.2

V pulse for 2 minutes (D). Scale bars=1 cm (A), 10 μm. (B-D). Height scale from dark to light=200 nm (B), 20 nm (C, D).

Figure 6A:
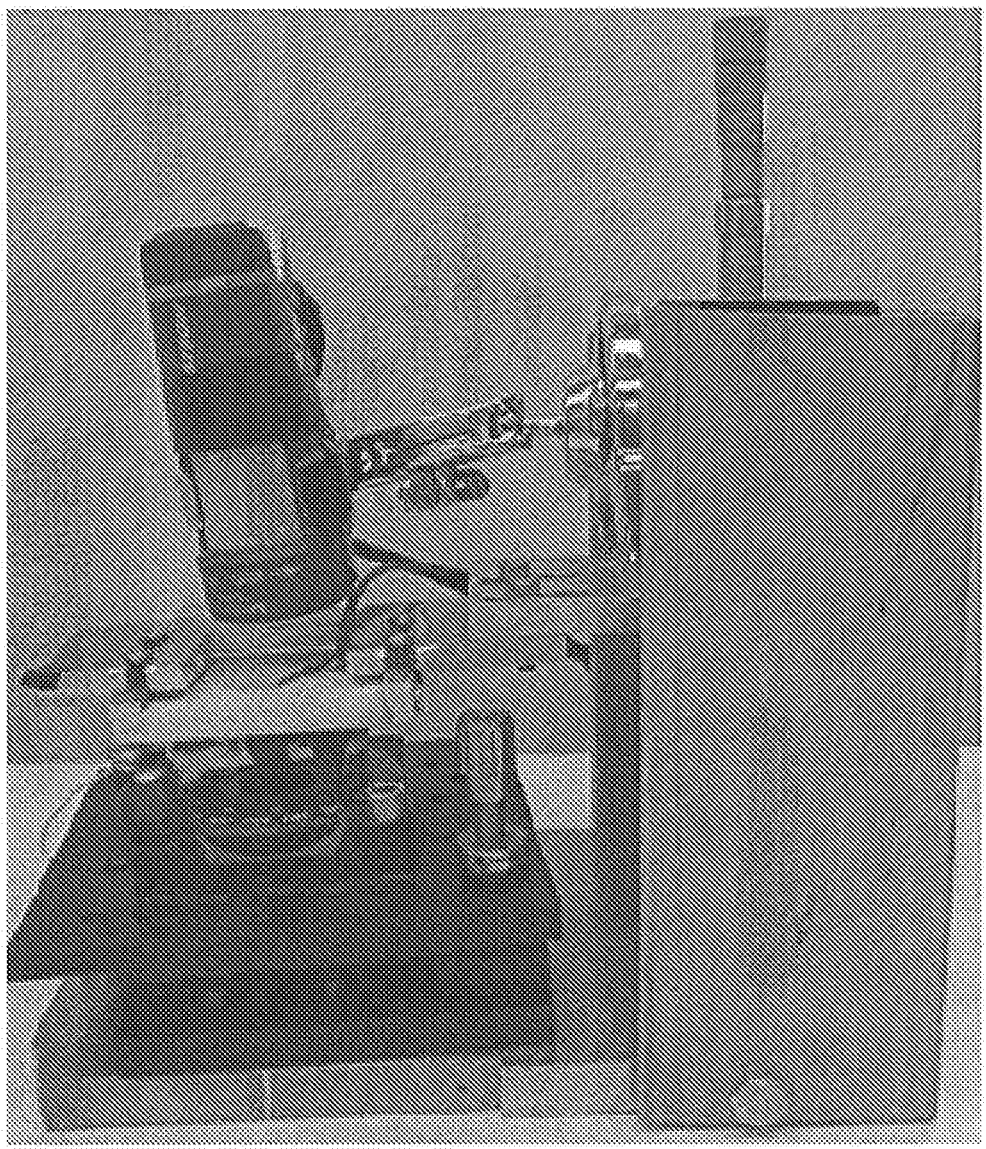
Figure 6B:
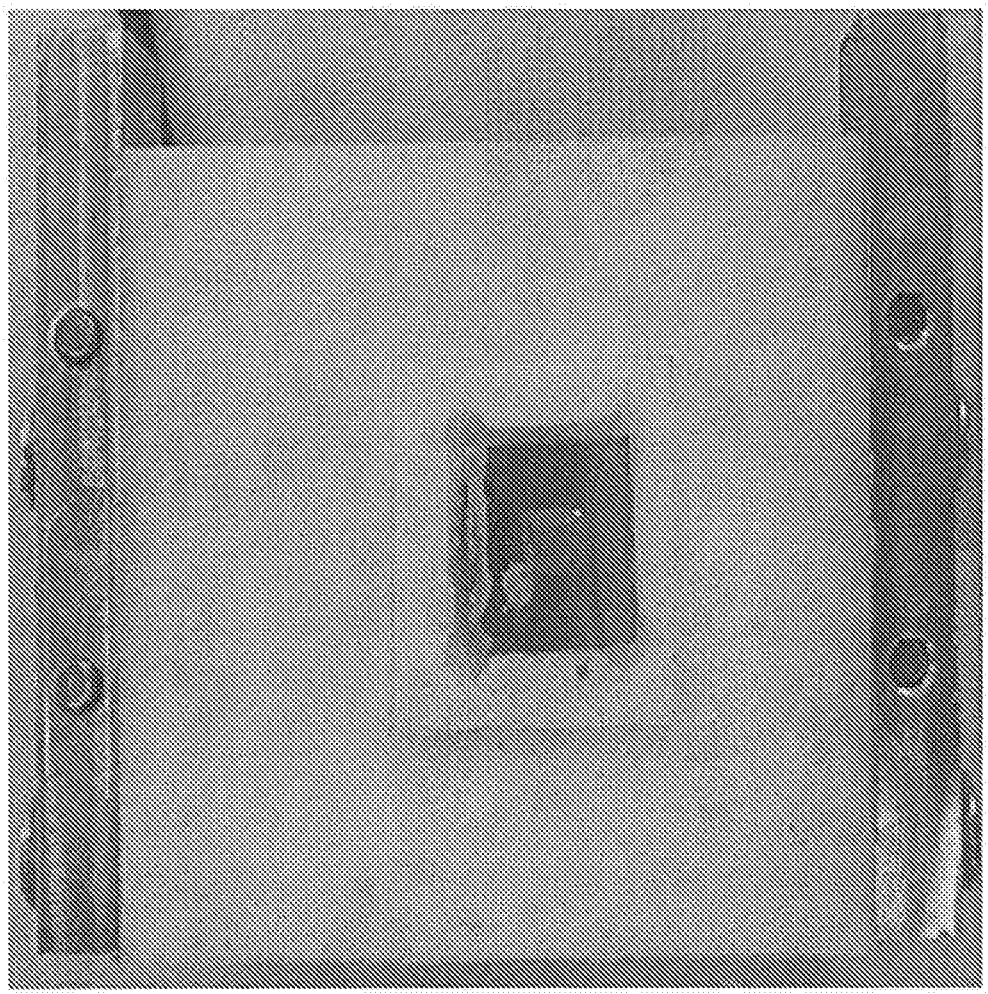
Figure 6C:
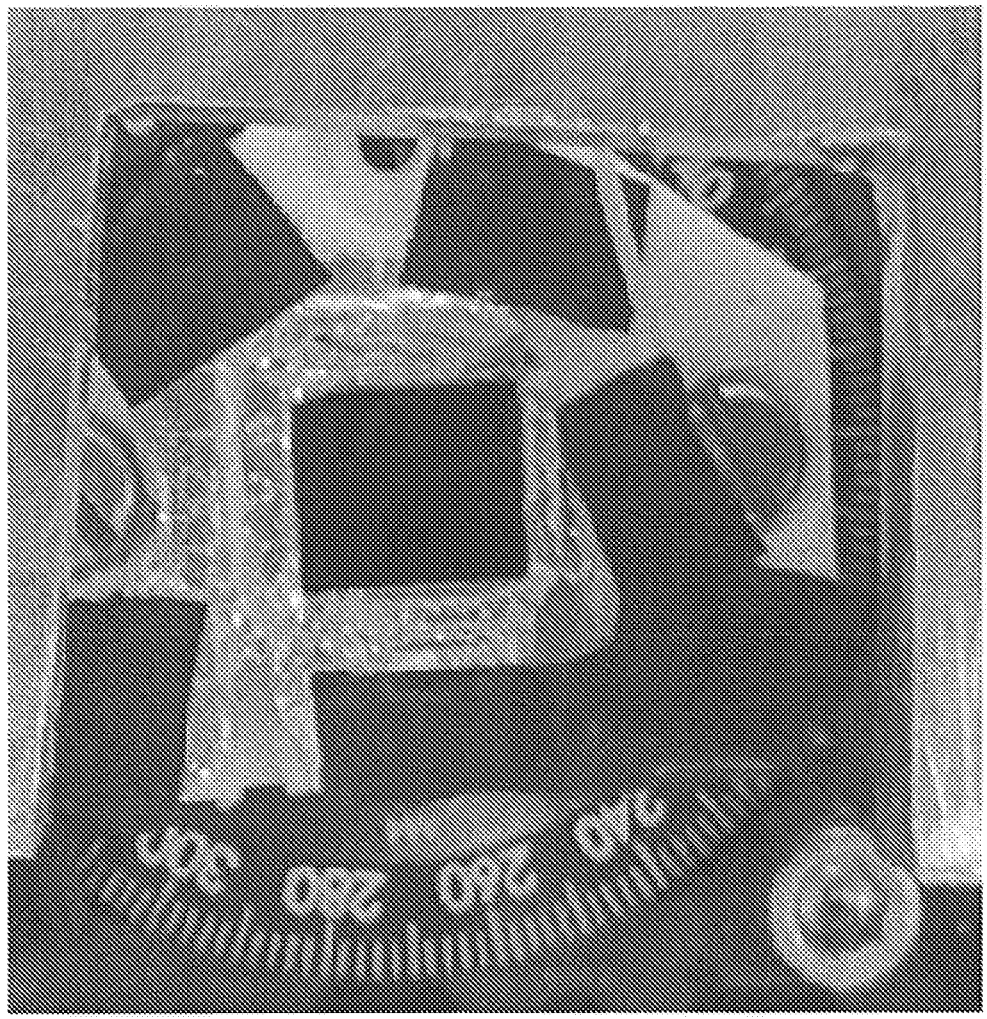

FIGS. 6A-6C. Stamp machine (A). Gold coated PDMS stamp mounted in a stamp holder (B), Silicon Substrate positioned in the substrate holder (C).

Figure 7:
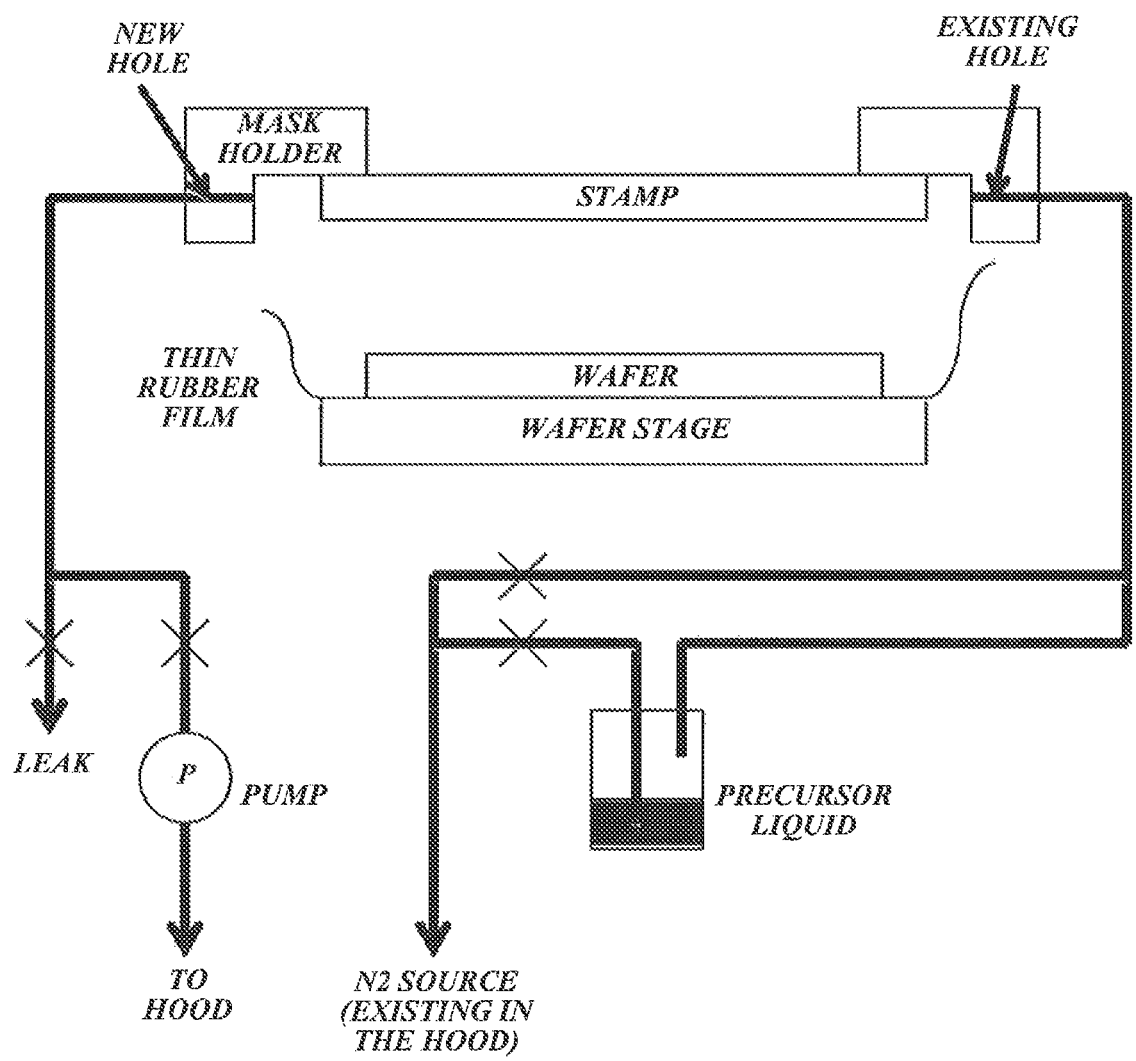

FIG. 7. Schematic illustration of a mask aligner converted to stamp inorganic nanostructures on a wafer substrate in accordance with the disclosed embodiments.

Figure 8:
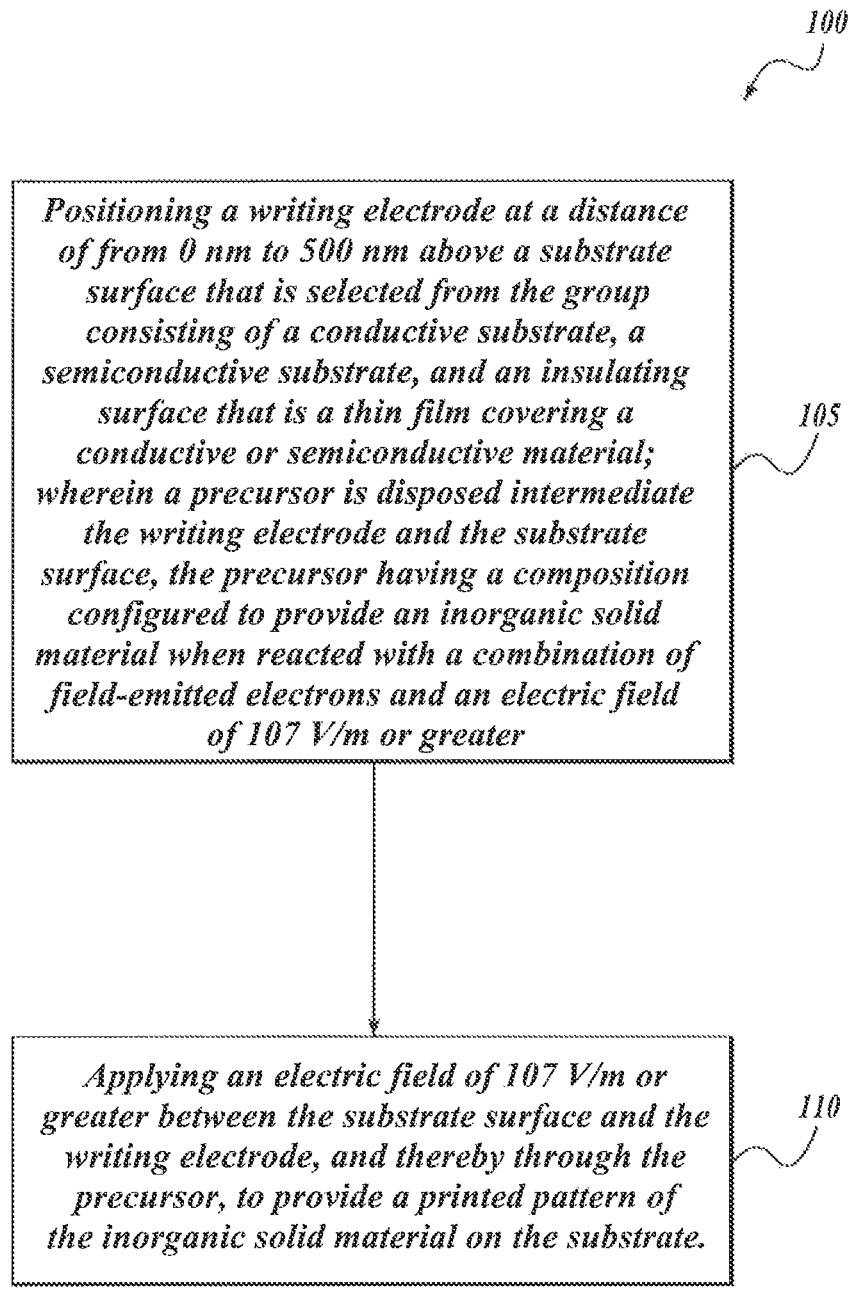

FIG. 8 is a flow chart illustrating a method for forming a pattern of an inorganic solid material on a substrate in accordance with the disclosed embodiments.

Figure 9A:
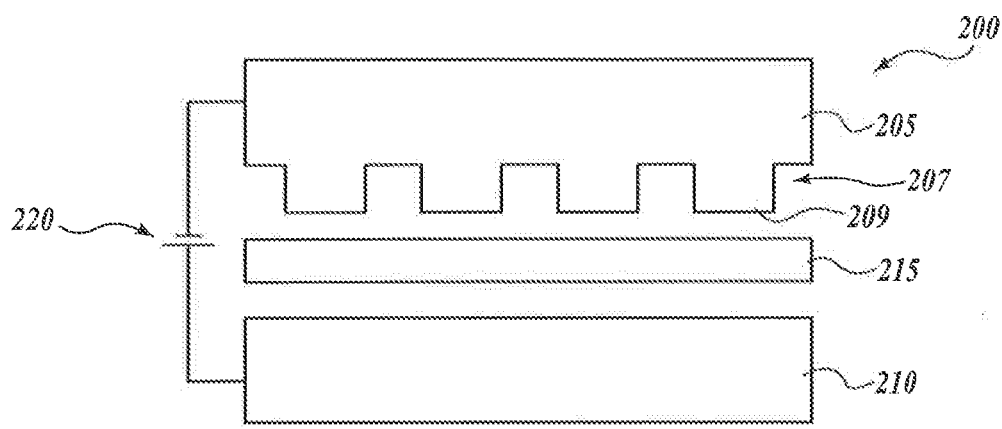
Figure 9B:
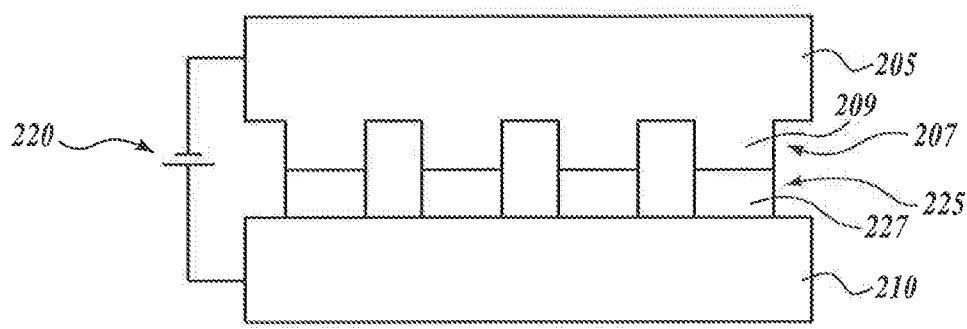
Figure 9C:
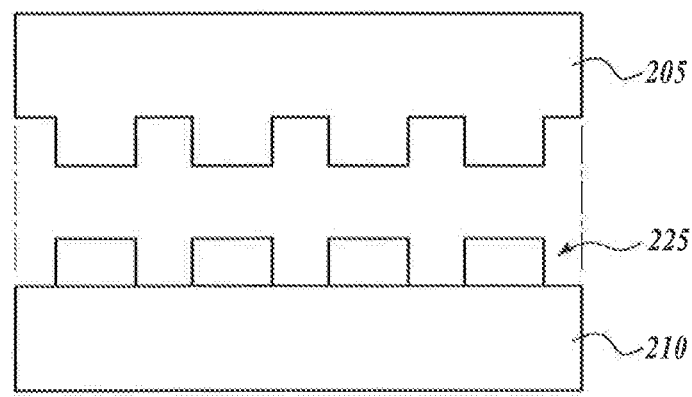

FIGS. 9A-9C are schematic cross-sectional illustrations of a method for forming a pattern of an inorganic solid material on a substrate in accordance with the disclosed embodiments.

DETAILED DESCRIPTION

Methods for forming inorganic nanostructures are provided. The methods create the inorganic nanostructures by positioning a writing electrode (e.g., a conductive "stamp") spaced nanometers above a substrate such that a precursor is intermediate the two. Applying an electric field, a voltage bias, an ionic current, or an electronic current between the writing electrode and the substrate converts the precursor into an inorganic solid material (e.g., a semiconductor such as silicon or germanium) in the area of, and in proximity of, the writing electrode. By using a stamp for the writing electrode, large area patterns of the inorganic nanostructures can be fabricated.

Accordingly, in one aspect, a method is provided for forming a pattern on a substrate. In one embodiment, as illustrated in FIG. 8, the method 100 includes the steps of:

In the method 100, the first step 105 is positioning a writing electrode at a distance of from 0 nm to 500 nm above a substrate surface that is selected from the group consisting of a conductive substrate, a semiconductive substrate, and an insulating surface that is a thin film covering a conductive or semiconductive material; wherein a precursor is disposed intermediate the writing electrode and the substrate surface, the precursor having a composition configured to provide an inorganic solid material when reacted with an electric field of $10^7$ V/m or greater.

A second step 110 is applying an electric field between the substrate surface and the writing electrode, and thereby through the precursor, to provide a printed pattern of the inorganic solid material on the substrate.

The method allows for macroscale, microscale, and nanoscale patterns formed from inorganic materials to be deposited on the substrate surface in parallel by using the writing electrode. Accordingly, in one embodiment the entire printed pattern is formed simultaneously. The shape of the printed pattern is limited only by the ability to form a writing electrode in the shape of the printed pattern desired.

The reaction to form the inorganic solid material is triggered by the stimulus delivered by the writing electrode in a determined area upon application of a bias voltage, direct current, or AC current or voltage. This includes electric field, electron emission, current, localized joule heating, and redox, which are independent of polarity and voltage magnitude.

In certain embodiments, the electric field generates field electron emission. Accordingly, in one embodiment, the inorganic solid material is a composition configured to provide an inorganic solid material when reacted with a combination of field-emitted electrons and an electric field of $10^7$ V/m or greater; and wherein applying the electric field generates the inorganic solid material by a combination of field-emitted electrons and the electric field of $10^7$ V/m or greater.

In one embodiment the writing electrode is a stamp having a relief pattern formed from a conductive material facing the substrate surface, and wherein the printed pattern of the inorganic solid material has the shape of the relief pattern. The relief pattern is the thickest region of the stamp; therefore, when the stamp is adjacent the substrate, the relief pattern is the portion of the stamp that abuts, or is closes to, the substrate.

In FIGS. 9A-9C, a representative method is illustrated utilizing a stamp to form a patterned inorganic solid material is illustrated diagrammatically in cross-section, Referring to FIG. 9A, an assembly 200 is provided for forming the inorganic solid material. A stamp 205 is provided that includes a relief pattern 207 comprising a plurality of raised stamp regions 209, which define the shape of inorganic solid material that will be deposited on a substrate 210. A precursor 215 is disposed intermediate the stamp 205 and the substrate 210. For purposes of simplicity, the precursor 215 is schematically illustrated as a box, but it will be appreciated that the precursor 215 can be a gas, liquid, or solid, contained (or not contained) in proximity to the stamp 205 such that the precursor 215 can be reacted to form the inorganic solid material.

Referring to FIG. 9B, the stamp 205 is brought within nanometers of (or into contact with) the substrate 210 and a voltage 220 is applied across the stamp 205 and substrate 210. Applying the voltage 220 causes the precursor 215 to react to form the inorganic solid material in a formed pattern 225 comprising a plurality of formed pattern regions 227 on the substrate 210. The formed pattern 225 has the same shape as the relief pattern 207. The thickness of the formed pattern 225 is defined by the distance separating the stamp 205 and the substrate 210 when the voltage 220 is applied, as well as the amount of precursor 215 available to supply the reaction to form the inorganic solid material.

Referring to FIG. 9C, the stamp 205 is removed from proximity to the substrate 210, which retains the formed pattern 225 of the inorganic solid material. Multiple patterns of the same or different inorganic solid material can be formed by repeating the method of FIGS. 9A-9C using the same or different stamp 205 with the same or different precursor 215.

Figure 1A:
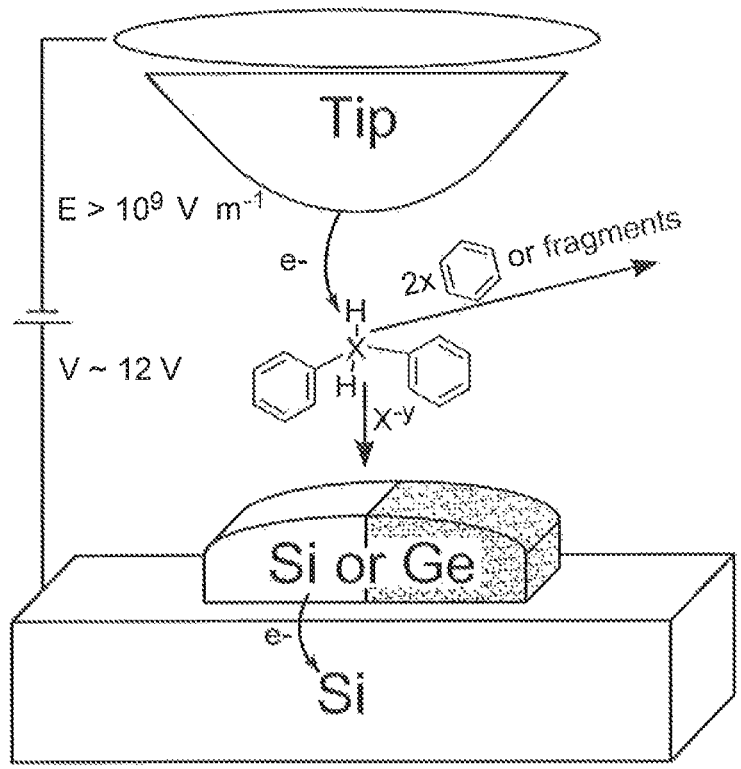
FIGS. 1A-1C. (A) Schematic of the probe sample geometry and deposition process for AFM direct-write. A moderate sample bias (~12V) induces a large electric field (>$10^9$ V $m^{-1}$). Electrons tunnel from the tip into the precursor molecule, where X=Ge or Si (B), and cause the fragmentation of the precursor and deposition of the desired product. (C) in the parallel patterning scheme, this reaction occurs at each of the multiple nanoscale asperities present on the stamp, yielding an array of deposited structures.
Figure 1B:
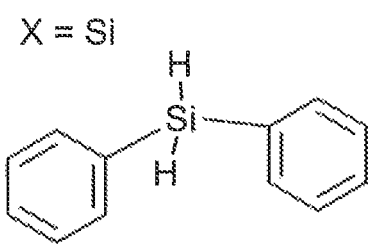
Figure 1B:
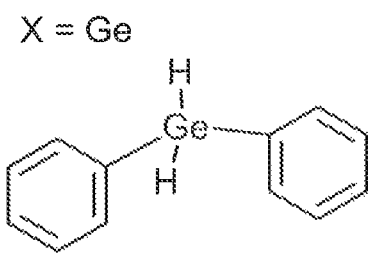
Figure 1C:
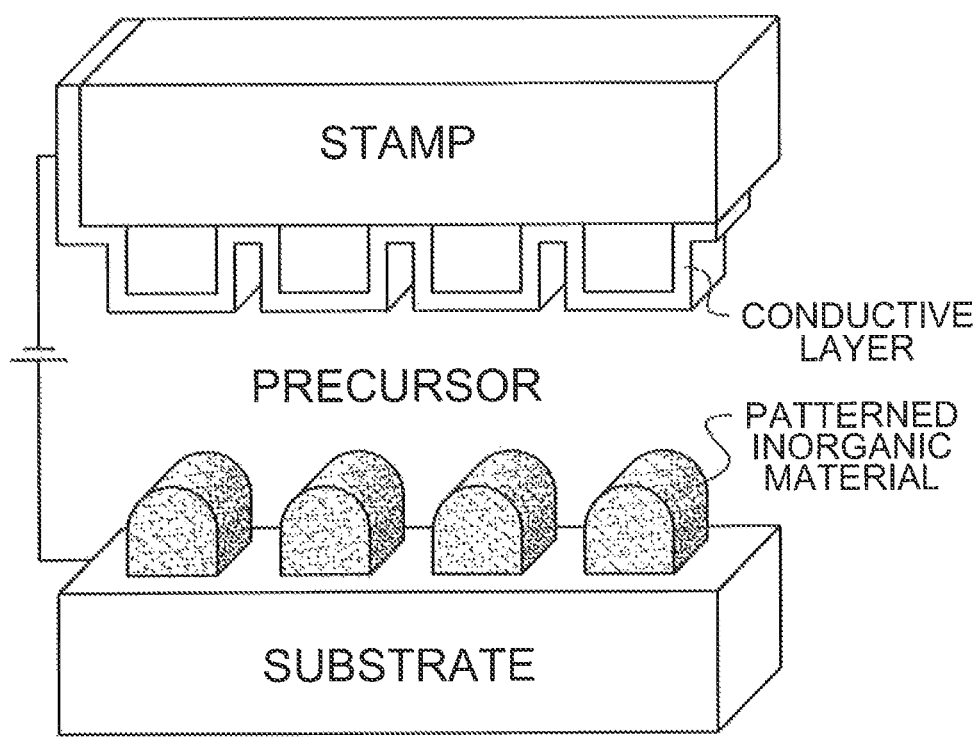

The stamp may be formed entirely from a conductive material, or a layer of conductive material can be deposited on the stamping surface of the stamp, such as illustrated in FIG. 1C, In the latter case, the body of the stamp can he made from a non-conductive material (e.g., a siloxane polymer) and the stamping surface coated with a layer of metal (e.g., gold) to form the stamp.

The relief pattern can be any shape known to those of skill in the art. Representative relief patterns are configured to form electrode pads, conductive trace patterns, and semiconducting regions of a semiconductor device (e.g., a transistor or a light-emitting diode).

Multiple iterations of the method can be used to "build up" devices on the substrate. The same relief pattern or different relief patterns can be used. For example, an integrated circuit could be formed by stamping layers of conductor, insulator, and semiconductor (using the method disclosed herein) to form a series of components (e.g., transistors, resistors, capacitors, etc.) with conductive traces connecting the components. Such an integrated circuit could be formed by forming a series of layers, each patterned by a stamp and formed from a precursor to provide the desired material compositions and patterns. There is, essentially, no limit to the patterns that can be formed using the method, as long as an appropriate stamp can be fabricated. Similarly, the compositions of the materials that can be formed using the method are only limited by the availability of an appropriate precursor.

Referring to FIG. 1C, a schematic diagram of a representative embodiment of the method is provided. Referring to FIG. 1C, a conductive stamp working electrode is positioned above a substrate with a precursor intermediate. Applying a field across the working electrode and the substrate forms patterned inorganic material from the precursor. Experimental results are presented in detail below.

In certain embodiments, the relief pattern has at least two non-contiguous regions, such that at least two separate areas of inorganic solid material will be formed on the substrate. For example, in FIG. 1C, each of the four illustrated portions of "patterned inorganic material" are considered separate and non-contiguous. This aspect of the stamping embodiments provides the ability to form structures in parallel (as opposed to serial) fabrication.

In one embodiment the stamp comprises a polymer substrate supporting the relief pattern. Any polymer known to those of skill in the art is compatible with the disclosed methods. In one embodiment the polymer substrate is rubber, plastic (e.g., polydimethylsiloxane), a metal, or a semiconductor. While the "stamp" writing electrode disclosed above is useful for providing relatively large-area nanostructures, in another embodiment the writing electrode is scanning-probe microscopy tip. In this embodiment, the printed pattern is formed by moving the scanning-probe microscopy tip while applying the electric field in the presence of the precursor. Scanning probe microscopy (SPM) tips include those used in scanning tunneling microscopy (STM) and atomic force microscopy (AFM). Commercial SPM systems can be modified to perform the disclosed methods. A schematic diagram of an exemplary embodiment of the SPM-based method is illustrated in FIG. 1A, wherein an SPM tip deposits Si and/or Ge on a substrate by applying a field across a gap that contains a precursor.

While using an SPM tip is a serial method, compared to the parallel "stamp" method, in one embodiment a plurality of scanning-probe microscopy tips are used simultaneously to form the printed pattern. Therefore, many SPM tips can be individually or uniformly controlled to form printed patterns on one or more substrates.

The precursor determines the composition of the inorganic solid material that is deposited by the method. Any precursor can be used that forms an inorganic solid material when reacted with a high electric field. In one embodiment the precursor is a precursor for an inorganic solid material selected from the group consisting of a metal, a semiconductor, and a dielectric. The formed inorganic solid material can be crystalline, amorphous, semicrystalline, nanocrystalline, or multicrystalline.

In one embodiment the precursor is selected from the group consisting of a liquid, a gas, a solid, and combinations thereof. While a liquid precursor is used in the exemplary results provided herein, the method is not limited as such.

Representative precursors include diphenylsilane, diphenylgermane, triphenylsilane, triphenylgermane, silane, germanium hydrides, III-IV organanometallics, II-VI organometallics, organometallic carbonyl, methyl silane, methylgermane, ethylsilane, ethylgermane, and, generally, any organometallic precursor gas, solid, or liquid.

Because the nanostructures formed by the method are inorganic solid materials, in one embodiment the precursor consists of inorganic compounds, However, to the extent that the inorganic solid material can be deposited using any type of compatible precursor, in other embodiments the precursor comprises inorganic and organic compounds, such that the inorganic solid includes organic compounds.

The method is very versatile with regard to the composition of the inorganic solid materials that can be formed. The composition is only limited by the ability to provide a precursor that will produce the desired inorganic solid material.

In one embodiment the precursor is a precursor for a single inorganic semiconductor. This is one of the least complex schemes for forming an inorganic solid material. For example, a semiconductor such as Si or Ge can be formed on the substrate from a precursor. This exemplary embodiment is disclosed below in the Examples.

Adding a degree of complexity, in another embodiment the precursor is a precursor for a compound inorganic semiconductor. By providing a precursor—or, more accurately, a first and a second precursor mixed together—a compound semiconductor, such as Ga/As. In this regard, the mixture of the first (e.g., Ga-containing) and second (As-containing) precursors are combined to form a single precursor mixture. Upon application of the field across the writing electrode and the substrate both parts of the precursor convert to solid material and a compound material, such as GaAs, is formed. Accordingly, in a further embodiment the precursor comprises a first precursor for a first inorganic semiconductor and a second precursor for a second inorganic semiconductor, and wherein the compound inorganic semiconductor formed on the substrate has a composition proportional to the amounts of the first precursor and the second precursor.

The method also allows one or more dopants to be incorporated into the inorganic solid material. By including dopants in the precursor, the dopants are then trapped within the inorganic solid material that is formed by applying an electric field, in certain embodiments, the dopant is unchanged in composition between the precursor and the inorganic solid material. in other embodiments, the precursor includes a dopant precursor that then forms the desired dopant composition upon application of the electric field and the formation of the inorganic solid material, which then incorporates the dopant, Dopants include, but are not limited to, phenylboranes, phenylarsenic, methylborane, methylarsenic, ethylborane, ethylarsenic, organoborane, organoarsine, boron gas, and arsenic gas.

In certain embodiments, the step of positioning the writing electrode comprises submerging the writing electrode in a solution of the precursor. In a further embodiment, the solution of the precursor is contained in a fluid cell. In certain ways, a solution-based precursor simplifies the method by allowing for controlled mixing of different components of the precursor, and the physical ability of the solution to infiltrate the nano-sized spaces between the writing electrode and the substrate. In order to facilitate using a solution, however, the method must be performed such that the solution is contained intermediate the writing electrode and the substrate. A fluid cell or other containment structure (examples illustrated in FIGS. 4C and 7) is preferable to manage solution-based precursors; however, surface tension can also be used. One advantage of a fluid cell is that it can be configured to allow for solution delivery, removal, and washing before and after deposition. Accordingly, a substrate could remain in a fluid cell while multiple layers are deposited using the method (using the same or different stamps), possibly with a wash step intermediate each deposition.

The substrate can be conductive, semiconductive, or an insulating surface layer covering a conductive or semiconductive substrate. The composition of the substrate can be any material know to those of skill in the art as long as the required electric field of $10^7$ V/m or greater can be applied from the substrate, through the precursor, to the writing. electrode.

The substrate must be conductive to the extent that it must support the required electric field of the method. However, the conductivity of the substrate need not be permanent, and materials that are semiconductive or insulating but can become conductive are also useful. For example, in one embodiment the semiconductive substrate or insulating surface is made conductive by shining light on it. Such photoconductive materials are well known to those of skill in the art. Other similar schemes for providing conductivity are also useful with the embodiments described herein.

In one embodiment, the step of positioning the writing electrode comprises using a piezoelectric device to manipulate the writing electrode, the substrate, or both. Such piezoelectric positioning devices are well known to those of skill in the art, particularly with regard to the stages used in SPM systems. Accordingly, an SPM system can be modified (as disclosed in the Examples below) in order to perform the disclosed method.

In one embodiment, the writing electrode and the substrate are integrated in a photolithography tool. In a further embodiment, the photolithography tool is selected from the group consisting of an aligner, a stepper, and any other device that precisely positions the electrode and the substrate, Such a modified mask aligner is illustrated in FIG. 7.

In one embodiment, the precursor is a vapor that is condensed between the stamp and the substrate. In another embodiment, the precursor is solid or a sol-gel that is present between the stamp and the substrate.

The disclosed method can be repeated multiple times in the same area or different areas. In certain embodiments, the stamp and/or the substrate may be flexible, such as in roll-to-roll printing architecture, The following examples are illustrative of the disclosed embodiments and not

EXAMPLES

Here, we show that this direct-write strategy can pattern a broad variety of semiconductor nanostructures. Si, Ge, and SiGe heterostructures can be fabricated both with single AFM tips as well as conducting stamps (FIGS. 1A-1C). Individual tips offer nanometer resolution in small areas, while conducting stamps afford low-cost high-throughput large-area nanofabrication. For high resolution direct-write, a biased AFM tip traces desired shapes on the substrate while both are immersed in an inorganic liquid precursor (FIG. 1A). A quartz cell designed for imaging in fluid (~1 ml) is used to contain the precursor. The electric field between the tip and the substrate ($>10^9$ V m$^{-1}$) initiates the chemical reaction that deposits the desired material onto the substrate. Germanium direct-write is accomplished from diphenylgermane (DPG, Gelest). For Si direct write we choose the Si equivalent of DPG, diphenylsilane (DPS, Sigma-Aldrich) (FIG. 1B). This family of precursors with aromatic groups is particularly suited for the AFM direct-write reactions. For these precursors, the most energetically favorable fragmentation route under high field and electron bombardment involves the two phenyls and the two hydrogens leaving as benzene. This leaves a Si or Ge radical or ion free for deposition onto the substrate. The direct-write product should thus be free of any carbon contamination, which is often a problem when using organometallic precursors.

Figure 2A:
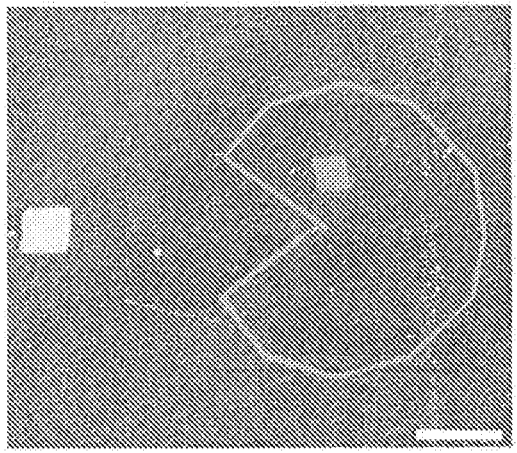
FIGS. 2A-2D Tapping mode topographic AFM images of: (A) Ge and Si heterostructure "PacMan." Ge pacman written at +12 V (sample) and 1 μm $s^{-1}$, Ge eyeball written at +11 V (sample) and 1 μm $s^{-1}$, Si pellet written at +12 V (sample) and 5 μm $s^{-1}$, (B) Ge and Si crossbars, Ge lines written at +16 V (sample) and 1 μm $s^{-1}$, Si lines written at +12 V (sample) and 1 μm $s^1$, (C) Detailed view of a crossbar node from the previous image d) ~70 nm wide SiGe lines written at 10 V and 100 μm $s^{-1}$ Height scale from dark to light yellow 10 nm (A), 5 nm (B, C, D). Scale bar=500 nm (A), 500 nm (B), 300 nm (C), 1 μm (D).
Figure 2B:
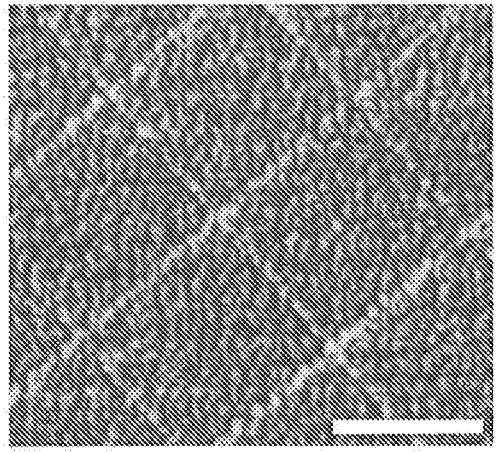
Figure 2C:
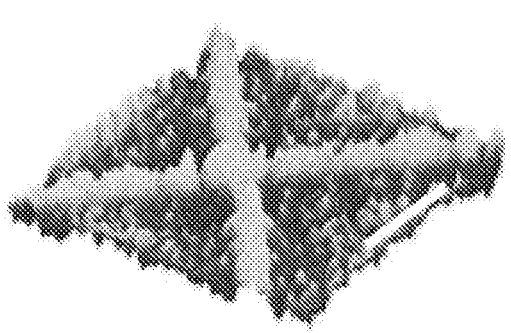
Figure 2D:
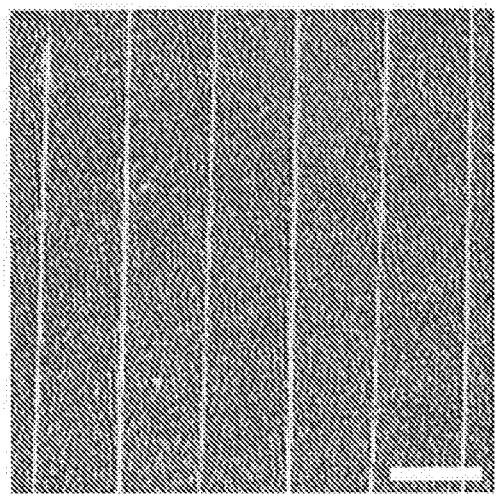

Ge and Si heterostructures are routinely produced at a rate of 1 μm sec$^{-1}$ (FIGS. 2A-2C). Complex architectures made of Si and Ge nanostructures can be easily fabricated. This is accomplished in a single direct-write session without the need of tip-sample realignment. First, Ge direct-write is performed in DPG (FIG. 2A, Pac-Man). Second, the reaction volume is flushed with an excess (>20 ml) of DPS to ensure minimal precursor cross-contamination. Third, Si direct write is performed from DPS (FIG. 2D, Pac-Dot), This is quite a general procedure that can produce Si Ge heterostructures (FIGS. 2B and 2C). Cross-bar architectures with Si and Ge nanoribbons intersecting each other are easily obtainable. Close analysis of the junctions shows that the second material (Si) is written on the top of the first one (Ge) when the direct-write patterns are crossed (FIG. 2C). Complex Si Ge nanoribbons junction devices may thus be fabricated using AFM direct-write. To further the variety of materials, proof-of-concept SiGe nanostructures were made (FIG. 2C). SiGe direct write is available because DPS and DPG are mutually soluble and can be easily introduced in the reaction volume.

Figure 3A:
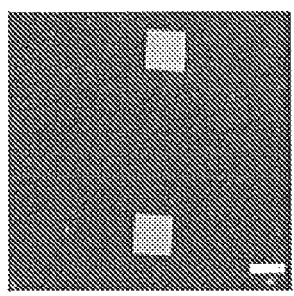
FIGS. 3A-3J. Representative AFM images of Si, Ge, and SiGe (A, D, G) pads (scale bars 2.5 μm, height scale=10 nm) and ToF-SIMS images (scale bars 2.5 μm, 256×256 pixels, 40 scans) of Si, Ge, and SiGe nanostructures respectively. Silicon ion count (from dark to light, B. E, H) and Germanium-74 ion count (C, F, I). Data was collected after cleaning with a 1 keV $O^{2+}$ beam to remove surface contamination.
Figure 3B:
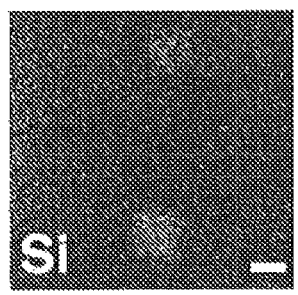
Figure 3C:
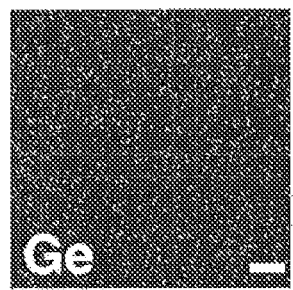
Figure 3D:
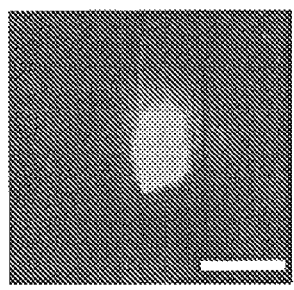
Figure 3E:
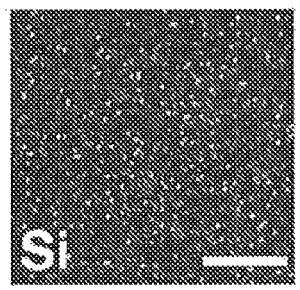
Figure 3F:
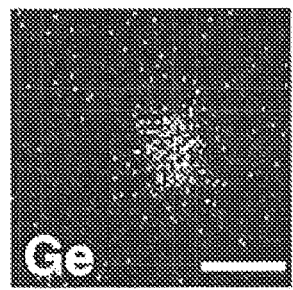
Figure 3G:
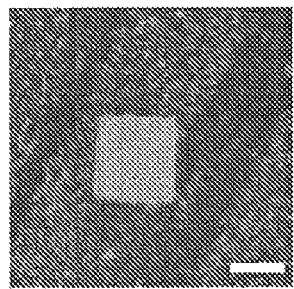
Figure 3H:
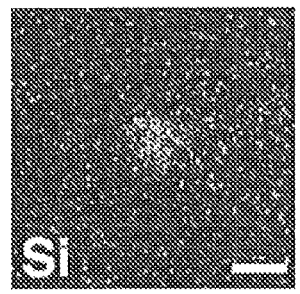
Figure 3I:
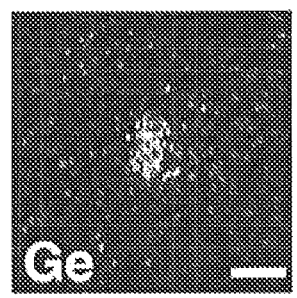

To ensure high-quality of the Si Ge direct-write patterns, we carefully perform chemical analysis of patterns deposited from filtered DPS and DPG (Whatman filter, 0.2 μm). Chemical composition is first determined using time-of-flight secondary ion mass spectroscopy (ToF-SIMS; FIGS. 3A-3I). To facilitate sample location, DPS, DPG, and 1:1 DPG:DPS microscopic pads are fabricated via AFM direct write (FIGS. 3A, 3D, and 3G). Because a Si nanostructure on a Si wafer does not provide chemical contrast, samples were prepared on a thin W film. From the ToF-SIMS scans, germanium (FIGS. 3A-3C) and silicon (FIGS. 3D-3F) are found only in structures nanofabricated from DIG and DPS respectively. For the sample prepared from DPS:DPG, both semiconductors are present in the SIMS spectra (FIGS. 3G-3I).

Figure 3J:
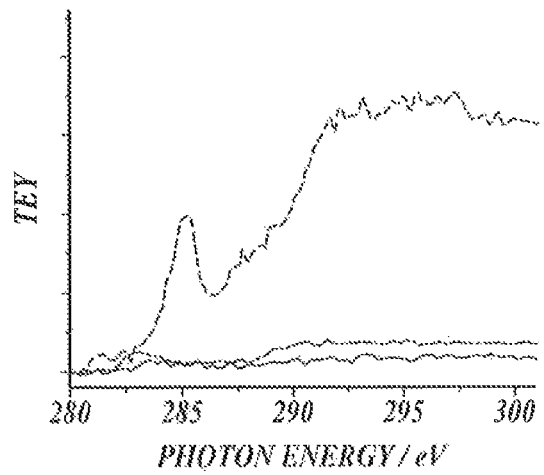

As purity is essential for electronic grade semiconductors, we carefully evaluate carbon contamination of the patterns. To this end, we employ near-edge X-ray absorption fine structure (NEXAFS) as recorded by a photo-emission electron microscope (PEEM; FIG. 3J). NEXAFS spectra were obtained with ~0.3 eV energy resolution from stacks of PEEM images taken at successive X-ray energies. Here, we estimate the relative carbon content from the C K-edge spectra of patterns prepared from DPG, DPS, and n-octane for comparison. From this data, it is clear that Ge fabricated nanostructures are completely carbon free and that Si fabricated structures contain, at most, carbon traces, The Ge result is not totally surprising. Ge has no carbon solubility over a broad temperature range. On the other hand, carbon readily dissolves in silicon up the formation of silicon carbide. The lack of carbon on the Si structures confirms that the phenyls on the precursor molecules are indeed good leaving groups for this chemistry. From this result, it is envisionable that other diphenyl or triphenyl-type organometallic precursors may be used to expand the composition of available nanostructures. Group III and group V precursors can also be used to create compound semiconductors. Furthermore, these precursors may be added in small quantities to DPS or DPG to dope nanostructures during growth.

Parallel Patterning Using Stamp Electrodes

Over the past few years, surface patterning techniques such as micro-contact printing have been employed for parallel fabrication. Using similar concept, the throughput of the AFM direct write can be increased by replicating the functionality of single tips into multiple tips working in parallel with micro structured conductive stamps. For demonstration of this concept, we built a simple stamping machine by taking advantage of the precise position control of an AFM platform (FIGS. 4A-4D). This approach follows the same philosophy of polymer pen lithography and eliminates the need for the fabrication of a complex stamping device. The approach enables us to fabricate massively parallel nanostructures by transfer of a pattern from polymer stamps onto substrates in a cost-efficient manner. Since the fabricated stamps are durable they can be reused many times. The main difference between our approach and polymer pen lithography is that the structures are grown from a localized reaction induced by the voltage applied between the stamp and the substrate.

Stamping Structures

Polydimethylsiloxane (PDMS) stamps were prepared by replica molding procedure using the surface of a blank compact disk (CD) as the master. PDMS preparation was done using a SYLGARD 184 elastomer kit. The elastomer base and the curing agent were mixed in 10:1 proportion. After pouring over the master, the PDMS was cured at 100° C. for 1 hour and subsequently the replica was peeled off from the master. Then the stamps were coated with a 5 nm Cr adhesion layer and a 50 nm gold conductive layer 50 nm using a Balzers PLS 500 e-beam evaporator.

Figure 4A:
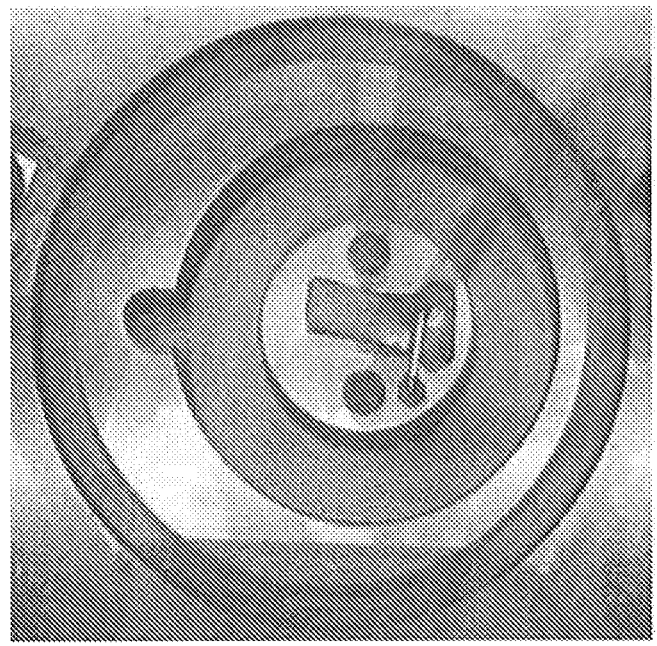
Figure 4B:
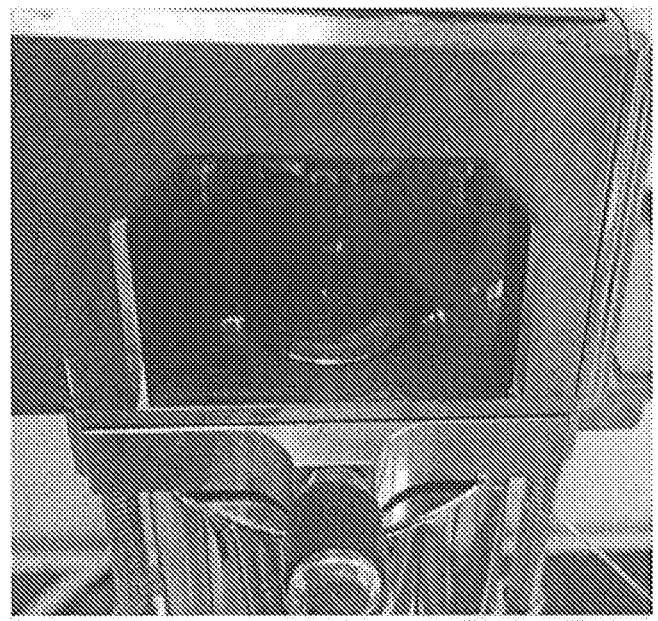
Figure 4C:
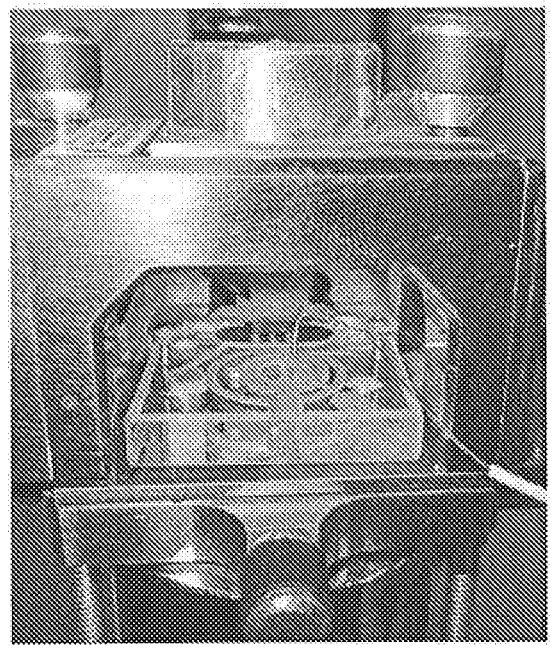
Figure 4D:
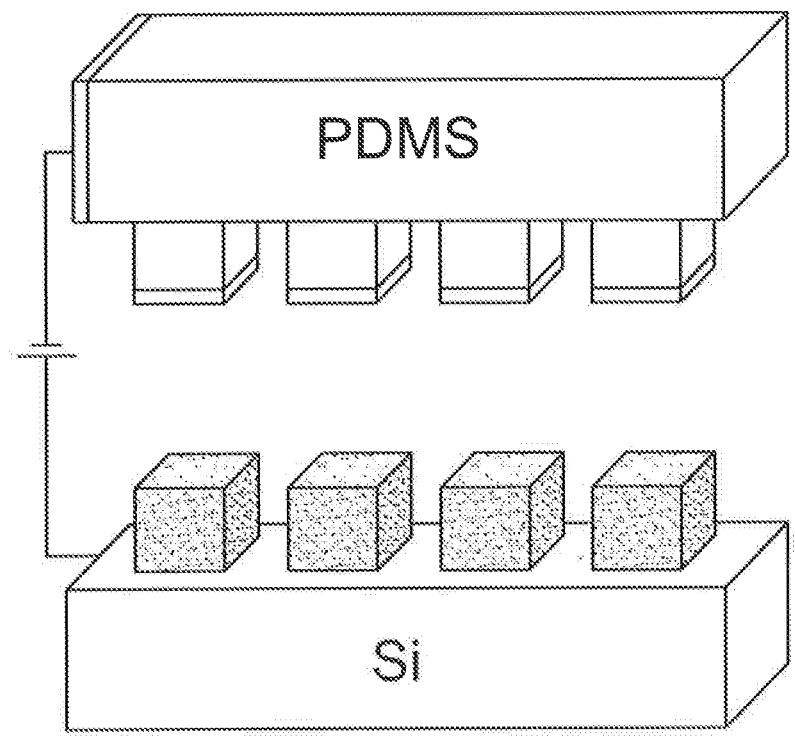

To demonstrate fabrication of Si/Ge nanostructures using flexible stamps, an AFM based stamping approach was used. Gold coated 2 mm×4 mm flexible PDMS stamps were mounted in an AFM quartz liquid cell (FIG. 4C). The liquid cell provides a contained environment for the condensation of an inorganic meniscus between the stamp and the substrate. A conductive substrate is mounted on the AFM piezo stage.

The liquid cell is purged of water by flowing dry $N_2$ at 3 L $min^{-1}$ for 30 min. Then either a DPG or DPS meniscus is formed between the stamp features and the surface by flowing saturated vapor at 3.5 L $min^{-1}$ for one hour. Subsequently the stamp was brought in contact with the substrate and a bias voltage of 31.2V was applied using a Tektronix PS283 DC power supply for a period of 2 minutes. This resulted in the deposition of the Si or Ge nanostructures on the substrates. After deposition, the substrate was washed with isopropanol and annealed at 550° C. to remove trace organics.

Figure 5A:
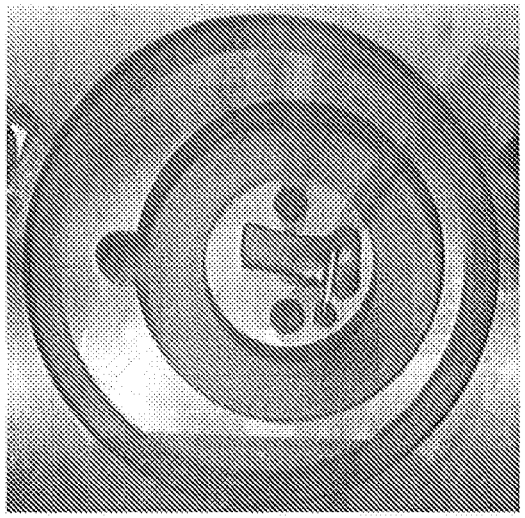
Figure 5B:
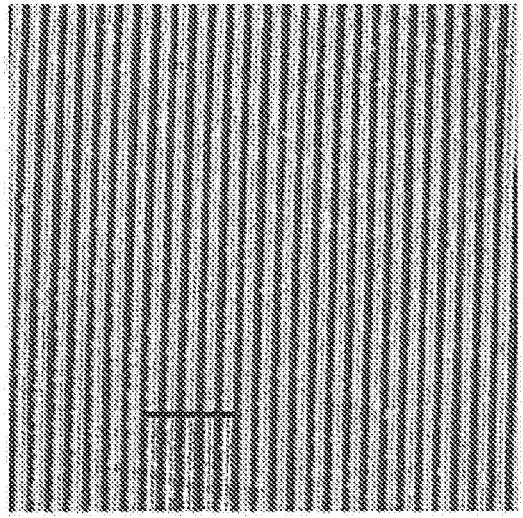
Figure 5C:
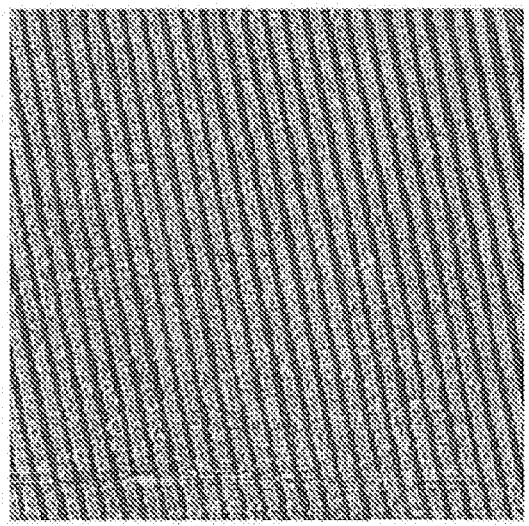
Figure 5D:
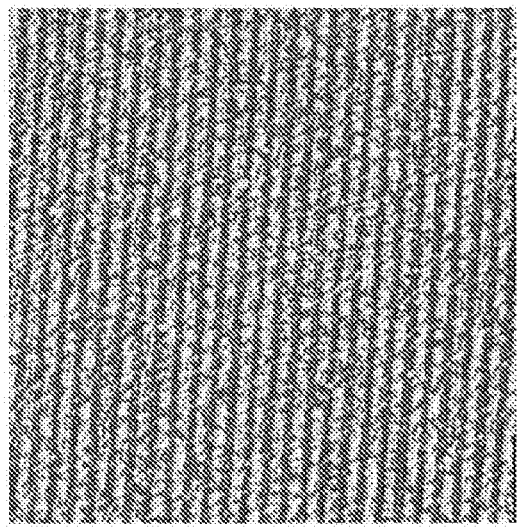

Using this technique, we demonstrated the parallel directed growth of Silicon and Germanium nanostructures (FIGS. 5B-5D). Unlike previous stamping techniques, this protocol uses the AFM for precise control of the contact between the stamp and the substrate, This technique can be extended to stamps fabricated using blank and written DVDs and Blu-Rays and is also compatible with multiple AFM tips in parallel. Furthermore, the stamping process can be accomplished in a custom made cheap stamping apparatus (FIGS. 6A-6C), which can be easily integrated with a mask aligner.

Experimental Section

Si (100) substrates (Addison Engineering, B doped, resistivity $\rho=0.02$ Ω cm, native oxide thickness ~2 nm) were cleaned. Nanostructure direct-write was performed on a Veeco Multimode V AFM with a fluid cell operated in contact mode with Sb-doped Si cantilevers (Nanoworld, $\rho=0.02$-0.025 Ω cm, spring constant k≈0.2 N $m^{-1}$). A bias was applied to the sample (+6 to +10 V) and/or the tip (−12 to 0 V) via the Nanoscope IV controller. The force setpoint was the same as for imaging in contact mode (≈1-10 nN). Patterning at lower or higher forces did not affect the patterns as long as contact with the sample was maintained during writing. After patterning, the samples were rinsed in acetone, methanol, and isopropanol. Tapping mode imaging was performed on the same AFM with Veeco Probes TESP Si (Sb) doped cantilevers ($\rho=0.01$-0.025 Ωcm, k=40 N $m^{-1}$, resonant frequency v≈300 kHz).

Time-of-flight secondary ion mass spectroscopy (ToF-SIMS) was performed at the Environmental Molecular Sciences Laboratory at Pacific Northwest National Laboratory with a TOF.SIMS5 spectrometer (ION-TOF GmbH, Germany). A 25 keV $Bi^+$ ion beam, which was focused into a diameter of ≈250 nm with a current of 0.6 pA at 20 kHz repeating rate, was used to image the area of interest. C K-edge NEXAFS spectra were collected at beamline 7.3.1 (PEEM-2) of the Advanced Light Source at the Lawrence Berkeley National Laboratory. Detector dark current was subtracted and the spectra were normalized to unity from 5 to 10 eV before the edge jump to extract chemical information that was encoded in the energy dependent absorption of the sample. Non-energy-dependent effects caused by differences in illumination and local work function were thus removed.

Stamps used for parallel patterning were fabricated, and were coated with a 5 nm Cr adhesion layer and a 50 nm gold conductive layer 50 nm using a Balzers PLS 500 e-beam evaporator. Voltage was applied to the stamp using a using a Tektronix PS283 DC power supply. After deposition, the printed substrates were washed with isopropanol and annealed at 550° C. to remove trace organics. Polydimethylsiloxane (PDMS) stamps were prepared by replica molding procedure using the surface of a blank compact disk (CD) as the master. PDMS preparation was done using SYLGARD 184 elastomer kit; the elastomer base and the curing agent were mixed in 10:1 proportion. After pouring over the master, the PDMS was cured at 100° C. for 1 hour and subsequently the replica was peeled off from the master. Then the stamps were coated with a 5 nm Cr adhesion layer and a 50 nm gold conductive layer 50 nm using a Balzers PLS 500 e-beam evaporator.

While illustrative embodiments have been illustrated and described, it will be appreciated that various changes can be made therein without departing from the spirit and scope of the invention.

The embodiments of the invention in which an exclusive property or privilege is claimed are defined as follows:

1. A method of forming a pattern on a substrate, comprising the steps of:
   (a) positioning a writing electrode within 500 nm of a substrate surface, wherein the substrate surface is selected from the group consisting of a conductive material, a semiconductive material, and an insulating material that is a thin film covering a conductive or semiconductive material;
   wherein a precursor is disposed in contact with the substrate surface, the precursor having a composition configured to provide an inorganic solid material when subjected to an electric field of $10^7$ V/m or greater; and
   (b) applying an electric field of $10^7$ V/m or greater between the substrate surface and the writing electrode, and thereby through the precursor, to provide a printed pattern of the inorganic solid material on the substrate.

2. The method of claim 1, wherein the writing electrode is a stamp having a relief pattern formed from a conductive material facing the substrate surface, and wherein the printed pattern of the inorganic solid material has the shape of the relief pattern.

3. The method of claim 2, wherein the stamp comprises a polymer substrate supporting the relief pattern.

4. The method of claim 3, wherein the polymer substrate is polydimethylsiloxane.

5. The method of claim 2, wherein the entire printed pattern is formed simultaneously.

6. The method of claim 1, wherein the writing electrode is scanning-probe microscopy tip.

7. The method of claim 6, wherein the printed pattern is formed by moving the scanning-probe microscopy tip while applying the electric field in the presence of the precursor.

8. The method of claim 6, wherein a plurality of scanning-probe microscopy tips are used simultaneously to form the printed pattern.

9. The method of claim 1, wherein the precursor is a precursor for an inorganic solid material selected from the group consisting of a metal, a semiconductor, and a dielectric.

10. The method of claim 1, wherein the precursor is a precursor for a single inorganic semiconductor.

11. The method of claim 1, wherein the precursor is a precursor for a compound inorganic semiconductor.

12. The method of claim 11, wherein the precursor comprises a first precursor for a first inorganic semiconductor and a second precursor for a second inorganic semiconductor, and wherein the compound inorganic semiconductor formed on the substrate has a composition proportional to the amounts of the first precursor and the second precursor.

13. The method of claim 1, wherein the precursor comprises one or more dopants that are incorporated into the inorganic solid material.

14. The method of claim 1, wherein the precursor is selected from the group consisting of a liquid, a gas, a solid, and combinations thereof.

15. The method of claim 1, wherein the precursor consists of inorganic compounds.

16. The method of claim 1, wherein the precursor comprises inorganic and organic compounds, such that the inorganic solid includes organic compounds.

17. The method of claim 1, wherein positioning the writing electrode comprises submerging the writing electrode in a solution of the precursor.

18. The method of claim 17, wherein the solution of the precursor is contained in a fluid cell.

19. The method of claim 1, wherein positioning the writing electrode comprises using a piezoelectric device to manipulate the writing electrode, the substrate, or both.

20. The method of claim 1, wherein the semiconductive substrate or insulating surface is made conductive by shining light on it.

21. The method of claim 1, wherein the writing electrode is configured to be integrated into a photolithography tool.

22. The method of claim 21, wherein the photolithography tool is selected from the group consisting of an aligner, a stepper, and any other device that precisely positions the electrode and the substrate.

23. The method of claim 1, wherein the writing electrode is in contact with the substrate surface.

24. The method of claim 1, wherein the writing electrode is not in contact with the substrate surface.

* * * * *